US012719458B2

(12) United States Patent
Kumagai

(10) Patent No.: US 12,719,458 B2
(45) Date of Patent: Aug. 25, 2026

(54) PULSE CURRENT APPLICATION DEVICE AND CONTROL METHOD OF PULSE CURRENT APPLICATION DEVICE

(71) Applicant: FUJI ELECTRIC CO., LTD., Kawasaki (JP)

(72) Inventor: Naoki Kumagai, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 133 days.

(21) Appl. No.: 18/930,100

(22) Filed: Oct. 29, 2024

(65) Prior Publication Data

US 2025/0211213 A1 Jun. 26, 2025

(30) Foreign Application Priority Data

Dec. 25, 2023 (JP) ................................ 2023-218413

(51) Int. Cl.
*H03K 3/57* (2006.01)
*G01R 31/26* (2020.01)

(52) U.S. Cl.
CPC ........... *H03K 3/57* (2013.01); *G01R 31/2642* (2013.01)

(58) Field of Classification Search
CPC .............................. H03K 3/57; G01R 31/2642
See application file for complete search history.

(56) References Cited

U.S. PATENT DOCUMENTS 7,164,570 B2 * 1/2007 Hourai ............. H03K 17/08142 361/159
8,836,338 B2 * 9/2014 Tyler ...................... H03K 17/18 324/418
10,451,665 B2 * 10/2019 Kumagai .............. H03K 17/74
2018/0340972 A1 11/2018 Kumagai

FOREIGN PATENT DOCUMENTS

JP 2018-201187 A 12/2018

* cited by examiner

*Primary Examiner* — Menatoallah Youssef
*Assistant Examiner* — Colleen J O Toole
(74) *Attorney, Agent, or Firm* — Rabin & Berdo, P.C.

(57) ABSTRACT

A pulse current application device, including: a first switching element and an inductive load connected in series between a power supply and a reference potential; a plurality of first commutation circuits connected in parallel to the inductive load between the reference potential and a connection point of the first switching element and the inductive load, and each including a current application target and a second switching element connected in series; a second commutation circuit connected in parallel to the inductive load; a third switching element connected between the inductive load and the reference potential; and a regenerative diode connected between the power supply and a connection point of the inductive load and the third switching element, the regenerative diode being configured to return a current flowing therethrough back to the power supply while the third switching element is in a cut-off state.

8 Claims, 5 Drawing Sheets

PULSE CURRENT APPLICATION DEVICE AND CONTROL METHOD OF PULSE CURRENT APPLICATION DEVICE

CROSS-REFERENCE TO RELATED APPLICATION

This application is based upon and claims the benefit of priority of the prior Japanese Patent Application No. 2023-218413, filed on Dec. 25, 2023, the entire contents of which are incorporated herein by reference.

BACKGROUND OF THE INVENTION

1. Field of the Invention

The embodiment discussed herein relates to a pulse current application device and a control method of the pulse current application device.

2. Background of the Related Art

A semiconductor element may degrade its properties due to a surge current applied thereto for a short time or another reason. Therefore, in order to check the reliability of the semiconductor element, a pulse current is applied to the semiconductor element, which is a device under test, to evaluate degradation.

As related art, for example, there has been proposed a technique of applying a pulse current generated from energy stored in an inductor, to a single device under test, with the switching control of a switching element (Japanese Laid-open Patent Publication No. 2018-201187).

SUMMARY OF THE INVENTION

According to one aspect, there is provided a pulse current application device, including: a first switching element; an inductive load connected in series with the first switching element, the inductive load and the first switching element being connected between a power supply and a reference potential; a plurality of first commutation circuits connected in parallel to the inductive load, each of the plurality of first commutation circuits being connected between the reference potential and a connection point of the first switching element and the inductive load, and including: a current application target, and a second switching element connected in series with the current application target; a second commutation circuit connected in parallel to the inductive load, the second commutation circuit being configured to have no current flowing therethrough while the second switching element is in a conductive state, and have a current flowing therethrough while the first switching element and the second switching element are in a cut-off state; a third switching element connected between the inductive load and the reference potential; and a regenerative diode connected between the power supply and a connection point of the inductive load and the third switching element, the regenerative diode being configured to return a current flowing therethrough back to the power supply while the third switching element is in a cut-off state.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Figure 1:
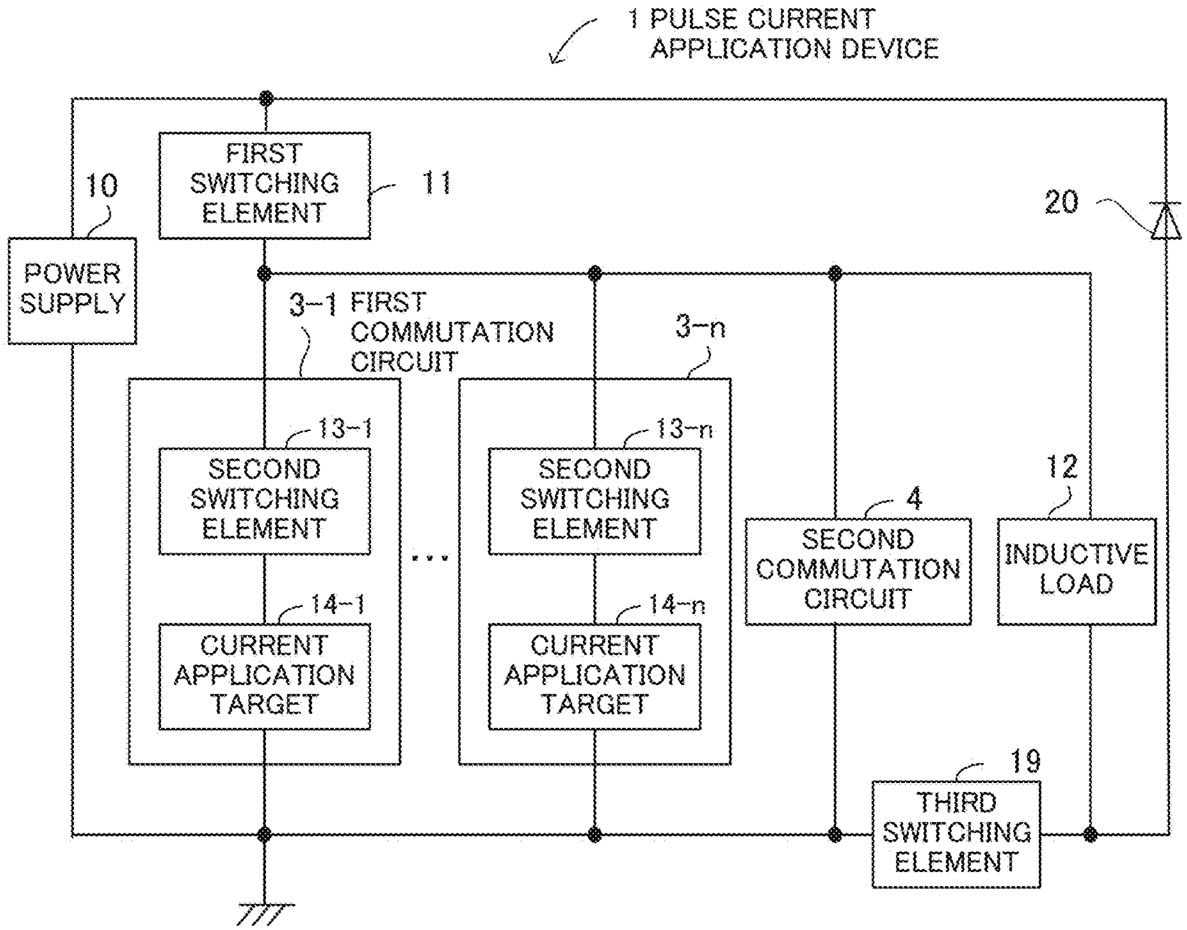
FIG. 1 is a view for describing an example of a pulse current application device.

Hereinafter, an embodiment will be described with reference to the accompanying drawings. Note that like reference numerals refer to like elements throughout the specification and drawings so as to omit the overlapping description.

FIG. 1 is a view for describing an example of a pulse current application device. The pulse current application device 1 includes a power supply 10, a first switching element 11, an inductive load 12, a plurality of first commutation circuits 3-1 to **3-*n*, a third switching element 19, a second commutation circuit 4, and a regenerative diode 20. For example, a metal-oxide-semiconductor field-effect transistor (MOSFET) or a MOS transistor may be used as each switching element provided in the pulse current application device 1**.

The inductive load 12 is connected in series with the first switching element 11, and the inductive load 12 and the first switching element 11 are connected between the power supply 10 and a reference potential (hereinafter, GND). The first commutation circuits 3-1 to **3-*n* are each connected in parallel to the inductive load 12 between the GND and a connection point of the first switching element 11 and the inductive load 12**.

In addition, the first commutation circuits 3-1 to **3-*n* include current application targets 14-1 to 14-*n* and second switching elements 13-1 to 13-*n* connected in series with the current application targets 14-1 to 14-*n*, respectively. In this connection, the current application targets 14-1 to 14-*n*** are devices under test, and a pulse current is applied thereto to evaluate degradation.

The second commutation circuit 4 is connected in parallel to the inductive load 12. A current does not flow through the second commutation circuit 4 when the second switching elements 13-1 to **13-*n* are in a conductive state, and a current flows through the second commutation circuit 4 when the first switching element 11 and the second switching elements 13-1 to 13-*n*** are in a cut-off state.

The third switching element 19 is connected between the inductive load 12 and the GND. The regenerative diode 20 is connected between the power supply 10 and the connection point of the inductive load 12 and the third switching element 19. The regenerative diode 20 returns a current back to the power supply 10 when the third switching element 19 is in a cut-off state.

The pulse current application device 1 is configured so that a current flowing the inductive load 12 is commutated to the plurality of first commutation circuits 3-1 to **3-*n* while successively switching commutation paths in sequence, in order to apply a short pulse current close to a square wave to the plurality of current application targets 14-1 to 14-*n***. This makes it possible to shorten the time needed to apply the pulse current.

Figure 2:
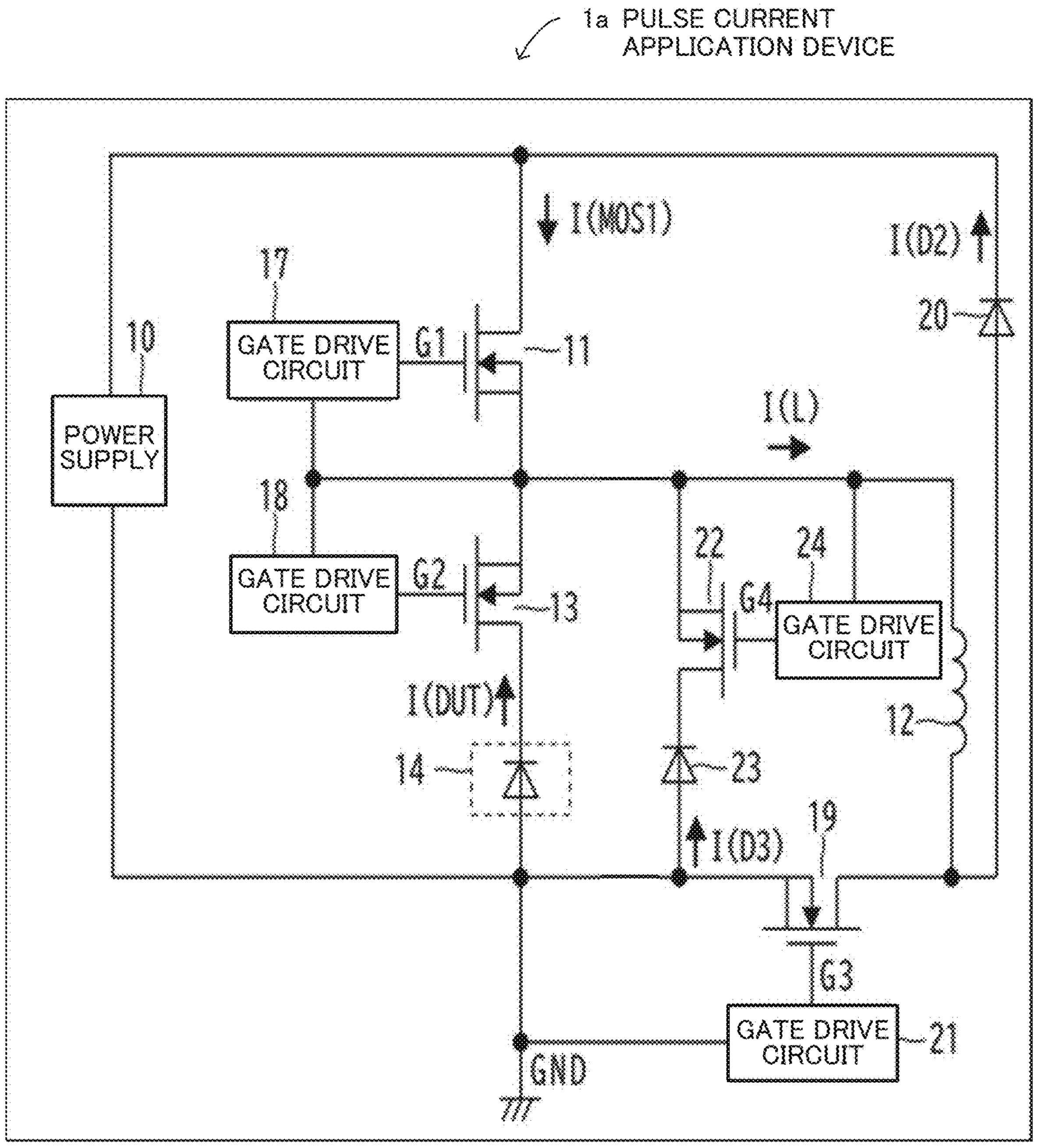
FIG. 2 illustrates an example of the configuration of a pulse current application device with a single first commutation circuit.
Figure 3:
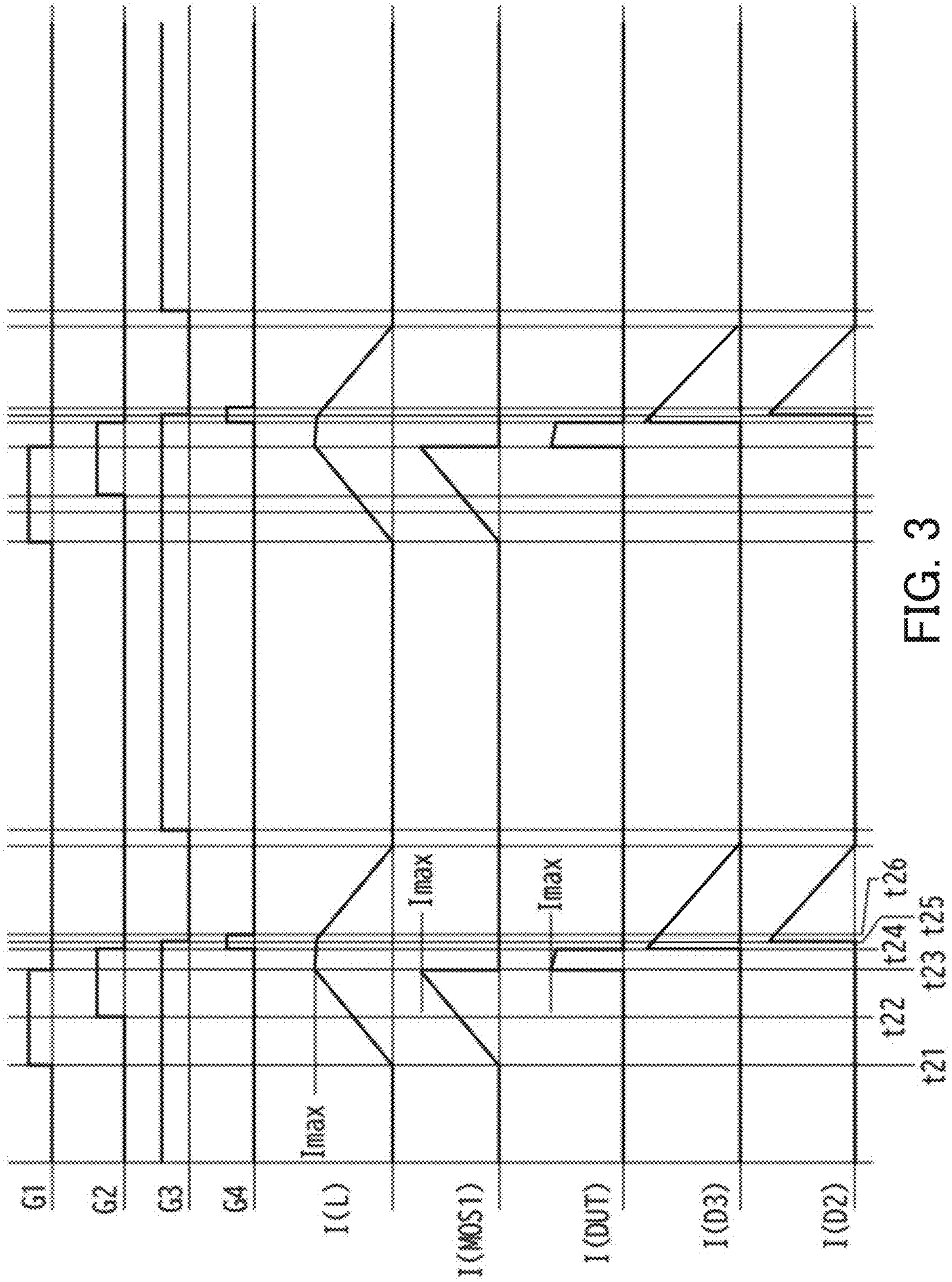
FIG. 3 is a timing diagram illustrating an example of the operation of the pulse current application device.

The following describes a pulse current application device with a single first commutation circuit with reference to FIGS. 2 and 3. FIG. 2 illustrates an example of the configuration of the pulse current application device with a single first commutation circuit. The pulse current application device **1*a* is configured to apply a large pulse current to a semiconductor element, and includes a power supply 10, a MOS transistor 11 (first switching element), a MOS transistor 13 (second switching element), a MOS transistor 19 (third switching element), and a MOS transistor 22 (fourth switching element). In addition, the pulse current application device 1*a* includes an inductor 12 (inductive load), a device under test (DUT) 14 (current application target), a diode 20 (regenerative diode), a diode 23, and gate drive circuits 17, 18, 21, and 24**.

The drain terminal of the MOS transistor 11 is connected to the positive terminal of the power supply 10 and the cathode terminal of the diode 20. The negative terminal of the power supply 10 is connected to the GND. In this connection, the diode 20 has a breakdown voltage higher than the voltage of the power supply 10.

The source terminal of the MOS transistor 11 is connected to one terminal of the inductor 12, and the other terminal of the inductor 12 is connected to the drain terminal of the MOS transistor 19 and the anode terminal of the diode 20. The source terminal of the MOS transistor 19 is connected to the GND.

The source terminal of the MOS transistor 11 is also connected to the source terminal of the MOS transistor 13. The drain terminal of the MOS transistor 13 is connected to one terminal of the DUT 14, and the other terminal of the DUT 14 is connected to the GND.

For example, a PiN diode using a silicon carbide (SiC) material or the body diode of a MOS transistor may be used as the DUT 14. In this case, the cathode terminal of the diode used as the DUT 14 is connected to the drain terminal of the MOS transistor 13, and the anode terminal of the diode used as the DUT 14 is connected to the GND.

The series circuit of the MOS transistor 13 and the DUT 14 forms a first commutation circuit that is connected in parallel to the inductor 12 and that commutates a current flowing through the inductor 12 so as to apply a pulse current to the DUT 14.

The source terminal of the MOS transistor 11 is also connected to the source terminal of the MOS transistor 22. The drain terminal of the MOS transistor 22 is connected to the cathode terminal of the diode 23, and the anode terminal of the diode 23 is connected to the GND.

The series circuit of the MOS transistor 22 and the diode 23 forms a second commutation circuit that is connected in parallel to the inductor 12 and that commutates a current flowing through the inductor 12 and first commutation circuit.

The gate drive circuit 17 is connected to the gate terminal of the MOS transistor 11, and supplies a gate voltage G1 thereto. The gate drive circuit 18 is connected to the gate terminal of the MOS transistor 13, and supplies a gate voltage G2 thereto. Likewise, the gate drive circuit 21 is connected to the gate terminal of the MOS transistor 19, and supplies a gate voltage G3 thereto. The gate drive circuit 24 is connected to the gate terminal of the MOS transistor 22, and supplies a gate voltage G4 thereto. The gate drive circuits 17, 18, 21, and 24 each perform a gate driving operation according to a switching control signal received from a control unit, not illustrated.

In this connection, the gate voltages G1, G2, G3, and G4 are referenced to the source terminals of the MOS transistors 11, 13, 19, and 22, respectively. Therefore, an insulating circuit such as a digital isolator is preferably used for signal transmission from a host device to the gate drive circuits 17, 18, 21, and 24.

For example, power switching elements with a breakdown voltage of 1,200 volts (V) and a pulsed drain current of 100 A are used as the MOS transistors 11 and 13. For example, a coil of several microhenries (μH) to several tens of μH, preferably 5 to 30 μH, is used as the inductor 12 that accumulates energy to apply a pulse current to the DUT 14. The voltage V (DC) of the power supply 10 is set from several tens to several hundreds of V.

FIG. 3 is a timing diagram illustrating an example of the operation of the pulse current application device. When the current I(L) of the inductor 12 is 0, the gate drive circuit 21 applies a high-level (H) gate voltage G3 to the gate terminal of the MOS transistor 19 to thereby turn on the MOS transistor 19. Thereby, the other terminal of the inductor 12 is connected to the GND.

At time t21, the gate drive circuit 17 applies a high-level (H) gate voltage G1 to the gate terminal of the MOS transistor 11 to thereby turn on the MOS transistor 11. At this time, a current I(MOS1), i.e., I(L) starts to flow through the inductor 12 from the power supply 10 via the MOS transistor 11. The current I(L) flowing through the inductor 12 increases as given by Equation (1).

$$di/dt = \{V(\mathrm{DC}) - Von(MOS1) - Von(MOS3)\}/L \quad (1)$$

In Equation (1), V (DC) denotes the voltage of the power supply 10, Von(MOS1) denotes the drain-source voltage of the MOS transistor 11 when the MOS transistor 11 is turned on, Von(MOS3) is the drain-source voltage of the MOS transistor 19 when the MOS transistor 19 is turned on, and L denotes the inductance of the inductor 12.

Then, at time t22 when the MOS transistor 11 is in the on state, the gate drive circuit 18 applies a high-level (H) gate voltage G2 to the gate terminal of the MOS transistor 13. Although the MOS transistor 13 is turned on, a reverse bias voltage is applied to the DUT 14, so that no current flows through the DUT 14.

Then, at time t23, the MOS transistor 11 is turned off, so that the current I(MOS1) that is supplied to the inductor 12 is cut off. The inductor 12 commutates the energy accumulated to maintain the current flow to the first commutation circuit.

Consequently, a current I(DUT) starts to flow through the DUT 14 in the first commutation circuit. At time t23 when this current I(DUT) starts to flow through the DUT 14, the current I(DUT) reaches its maximum current value Imax. After that, the current I(DUT) gradually decreases as given by Equation (2). In Equation (2), Von(MOS2) denotes the drain-source voltage of the MOS transistor 13 when the MOS transistor 13 is turned on, and Vf(DUT) denotes a forward voltage of the DUT 14.

$$-di/dt=\{Von(MOS2)+Von(MOS3)+Vf(DUT)\}/L \quad (2)$$

Then, at time t24, the MOS transistor 13 is turned off, and the gate drive circuit 24 applies a high-level (H) gate voltage G4 to the MOS transistor 22 to thereby turn on the MOS transistor 22. Thus, the current I(DUT) flowing through the first commutation circuit is now commutated to the second commutation circuit including the MOS transistor 22 and diode 23, so that a current I(D3) starts to flow. Therefore, a short pulse with a pulse width of the period (t24-*t*23) has flown through the DUT 14.

Then, at time t25, the MOS transistor 19 is turned off, the path from the second commutation circuit to the GND is cut off, and the current flowing through the inductor 12 is commutated to the diode 20 and is then returned as a current I(D2) back to the power supply 10. Then, at time t26, the MOS transistor 22 is turned off.

In order to evaluate the degradation of the DUT 14, it is desirable to apply as constant a pulse current as possible to the DUT 14. In addition, to cause a predetermined current to flow through the inductor 12, the current needs to flow at di/dt=V/L, which is determined by the inductance L of the inductor 12 and the power supply voltage V for causing the current to flow through the inductor 12. Therefore, to improve the constant current characteristic of the pulse current that is commutated and applied to the DUT 14, the inductance L needs to be increased.

Note, however, that increasing the inductance L results in a decrease in di/dt. Therefore, in the case of causing a current of a predetermined value (Imax) to flow through the inductor 12 and then applying the current to the DUT 14, the time period (t23-*t*21) needed for the current in the inductor 12 to reach the predetermined value (Imax) becomes long. This makes it difficult to shorten the repetitive cycle in which the pulse current is applied, which results in a long evaluation time.

In this connection, −di/dt (during the time period in which the current I(L) decreases from Imax to 0) of the current I(L) in the inductor 12 is determined by the on-voltages of the MOS transistors 13 and 19, the Vf (forward voltage) of the DUT 14, a voltage drop caused by wiring resistance, and others. In addition, di/dt (during the time period (t23-*t*21)) of the current I(L) in the inductor 12 is determined by the differences between the voltage of the power supply 10 and the on-voltages of the MOS transistors 11 and 19.

Therefore, it is possible to increase the rate |di/dt| by increasing the power supply voltage of the power supply 10 (since MOS transistors of SiC have the great advantage of high breakdown voltage, the increase in the power supply voltage of the power supply 10 takes advantage of the properties of the MOS transistors).

However, since there is a limit to increasing the rate |di/dt| by increasing the power supply voltage, it is difficult to shorten the application cycle of the pulse current to the DUT 14. For this reason, in the case of evaluating a plurality of DUTs, it takes a long time to evaluate the DUTs with the circuit configuration illustrated in FIG. 2.

In this connection, in order to evaluate a plurality of DUTs simultaneously, parallel connection and series connection are considered as means to connect the DUTs. However, in the parallel connection, it is difficult to cause the current to flow equally through the plurality of DUTs, due to variations in the forward voltages Vf of the DUTs. Also, the power supply 10 with a large capacity is needed, which increases the size of the device.

In the case of the series connection, the standards for energization stipulate that a reverse bias voltage is an operating voltage (an inverter bus voltage). Therefore, there is a need to increase the voltage of the power supply 10 in proportion to the number of series-connected DUTs. This case also increases the size of the device, and it is not easy to apply the reverse voltage equally to the series-connected elements.

Figure 4:
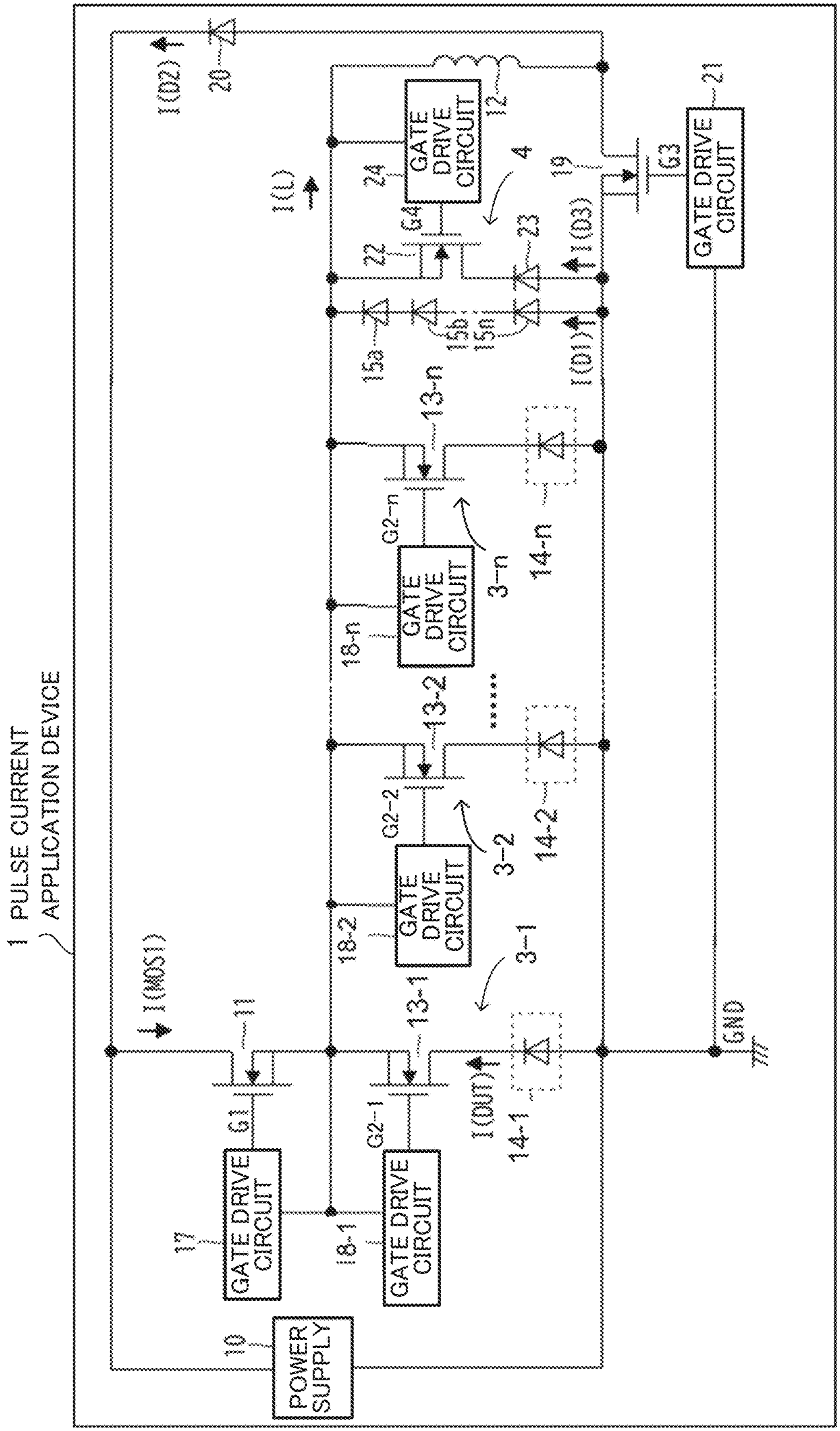
FIG. 4 illustrates an example of the configuration of a pulse current application device with a plurality of first commutation circuits.
Figure 5:
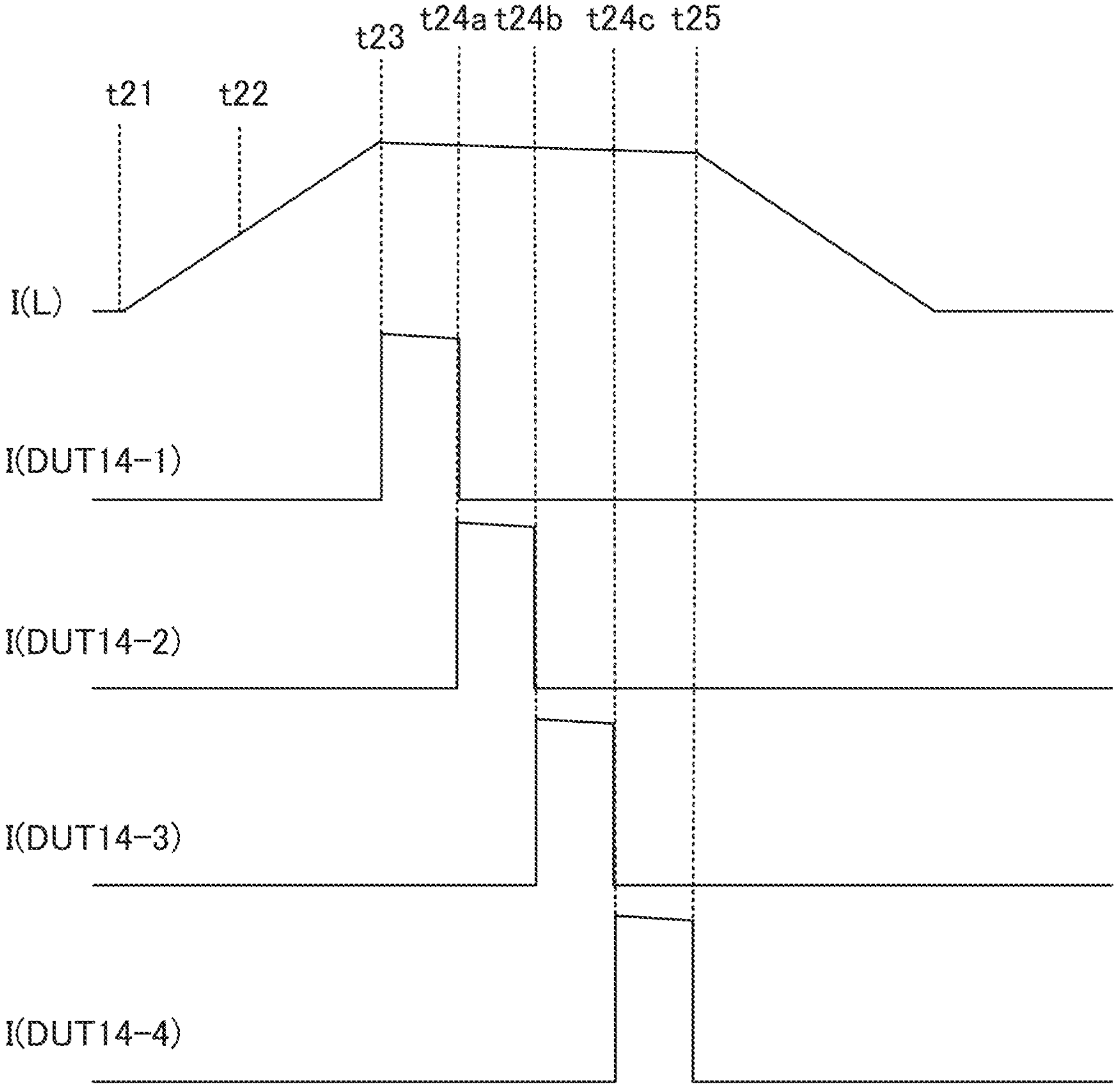
FIG. 5 is a timing diagram illustrating an example of the operation of the pulse current application device.

The following describes, with reference to FIGS. 4 and 5, a pulse current application device of the present disclosure that is provided with a plurality of first commutation circuits so as to evaluate a plurality of DUTs.

FIG. 4 illustrates an example of the configuration of a pulse current application device with a plurality of first commutation circuits. The pulse current application device 1 is configured to apply a large pulse current to semiconductor elements, and includes a power supply 10, a MOS transistor 11 (first switching element), MOS transistors 13-1 to 13-*n* (second switching elements), a MOS transistor 19 (third switching element), and a MOS transistor 22 (fourth switching element). In addition, the pulse current application device 1 includes an inductor 12 (inductive load), DUTs 14-1 to 14-*n* (current application targets), diodes 15*a* to 15*n*, a diode 20 (regenerative diode), a diode 23, and gate drive circuits 17, 18-1 to 18-*n*, 21, and 24.

The drain terminal of the MOS transistor 11 is connected to the positive terminal of the power supply 10 and the cathode terminal of the diode 20. The negative terminal of the power supply 10 is connected to the GND. The source terminal of the MOS transistor 11 is connected to one terminal of the inductor 12, and the other terminal of the inductor 12 is connected to the drain terminal of the MOS transistor 19 and the anode terminal of the diode 20. The source terminal of the MOS transistor 19 is connected to the GND.

The source terminal of the MOS transistor 11 is also connected to the source terminals of the MOS transistors 13-1 to 13-*n*. The drain terminals of the MOS transistors 13-1 to 13-*n* are each connected to one terminal of the respective DUTs 14-1 to 14-*n*. The other terminal of each DUT 14-1 to 14-*n* is connected to the GND.

As described earlier, for example, PiN diodes using a silicon carbide (SiC) material or the body diodes of MOS transistors may be used as the DUTs 14-1 to 14-*n*. In this case, the cathode terminals of the diodes used as the DUTs 14-1 to 14-*n* are connected to the drain transistors terminals of the MOS 13-1 to 13-*n*, respectively, and the anode terminals of the diodes used as the DUTs 14-1 to 14-*n* are connected to the GND.

The series circuit of the MOS transistor 13-1 and DUT 14-1 forms a first commutation circuit 3-1, and the series circuit of the MOS transistor 13-2 and DUT 14-2 forms a first commutation circuit 3-2. Likewise, the series circuit of the MOS transistor 13-*n* and DUT 14-*n* forms a first commutation circuit 3-*n*.

The plurality of first commutation circuits 3-1 to 3-*n* are connected in parallel to the inductor 12, and commutate a current flowing through the inductor 12 to apply a pulse current to the corresponding DUTs 14-1 to 14-*n*.

The source terminal of the MOS transistor 11 is further connected to the source terminal of the MOS transistor 22. The drain terminal of the MOS transistor 22 is connected to the cathode terminal of the diode 23, and the anode terminal of the diode 23 is connected to the GND.

The series circuit of the MOS transistor 22 and diode 23 forms a second commutation circuit 4 that is connected in parallel to the inductor 12 and that commutates a current flowing through the inductor 12 and first commutation circuits 3-1 to 3-*n*.

The gate drive circuit 17 is connected to the gate terminal of the MOS transistor 11, and supplies a gate voltage G1 thereto. The gate drive circuits 18-1 to 18-*n* are connected to the MOS transistors 13-1 to 13-*n*, respectively, and supply gate voltages G2-1 to G2-*n* thereto, respectively.

In addition, the gate drive circuits 21 and 24 are connected to the gate terminals of the MOS transistors 19 and 22, respectively, and supply gate voltages G3 and G4 thereto, respectively. The gate drive circuits 17, 18-1 to 18-*n*, 21, and 24 each perform a gate driving operation according to a switching control signal received from a control unit, not illustrated.

A series circuit of n diodes 15*a* and 15*b* to 15*n* is added to the second commutation circuit 4. In this connection, the sum of the forward voltages of the diodes 15*a* and 15*b* to 15*n* is set higher than the sum of the on-voltages of the MOS transistors 13-1 to 13-*n* and the forward voltages of the DUTs 14-1 to 14-*n*.

The functions of the diodes 15*a* and 15*b* to 15*n* will now be described. For example, there are cases in which the timing of the MOS transistor 13-*n* being turned off in the first commutation circuit 3-*n* among the first commutation circuits 3-1 to 3-*n* does not coincide with the timing of the MOS transistor 22 being turned on in the second commutation circuit 4 due to noise or others, and the turning-on timing of the MOS transistor 22 is delayed.

If this happens, the current I(L) flowing through the inductor 12 is not smoothly commutated from the first commutation circuit 3-*n* to the second commutation circuit 4, and the MOS transistor 13-*n* may be applied with a voltage exceeding the breakdown voltage thereof. Because of this and other reasons, the MOS transistor 13-*n* may be damaged.

In the case where the timing of the MOS transistor 22 being turned on is delayed behind the timing of the MOS transistor 13-*n* being turned off, the current I(L) in the inductor 12 flows through the series circuit of the diodes 15*a* and 15*b* to 15*n*. That is, since the series circuit of the diodes 15*a* and 15*b* to 15*n* prevents an abnormally high voltage from being applied to the MOS transistor 13-*n* of the first commutation circuit 3-*n*, there is no risk of damaging the MOS transistor 13-*n*.

FIG. 5 is a timing diagram illustrating an example of the operation of the pulse current application device. This timing diagram relates to a case where n is set to 4, i.e., a case where four first commutation circuits 3-1 to 3-4 are provided. At time t21, the gate drive circuit 17 applies a high-level (H) gate voltage G1 to the gate terminal of the MOS transistor 11 to turn on the MOS transistor 11.

At this time, a current I(MOS1), or I(L) starts to flow from the power supply 10 to the inductor 12 through the MOS transistor 11. The current I(L) flowing through the inductor 12 increases as given by Equation (1).

Then, at time t22 when the MOS transistor 11 is in the on state, the gate drive circuit 18-1 applies a high-level (H) gate voltage G2-1 to the gate terminal of the MOS transistor 13-1. Although the MOS transistor 13-1 is turned on, a reverse bias voltage is applied to the DUT 14-1. Therefore, no current flows through the DUT 14-1.

Then, when the MOS transistor 11 is turned off at time t23, the current I(MOS1) that is supplied to the inductor 12 is cut off. The inductor 12 commutates the energy accumulated to maintain the current flow, to the first commutation circuit 3-1. Consequently, a current I(DUT) starts to flow through the DUT 14-1.

Then, at time t24*a*, the MOS transistor 13-1 is turned off, and the gate drive circuit 18-2 applies a high-level (H) gate voltage G2-2 to the gate terminal of the MOS transistor 13-2 to thereby turn on the MOS transistor 13-2.

Thereby, all the current I(DUT) that flows through the first commutation circuit 3-1 is now commutated to the first commutation circuit 3-2 including the MOS transistor 13-2 and DUT 14-2. Therefore, a short pulse current I(DUT14-1) with a pulse width of the period (t24*a*-t23) has flown through the DUT 14-1 of the first commutation circuit 3-1.

Then, at time t24*b*, the MOS transistor 13-2 is turned off, and the gate drive circuit 18-3 applies a high-level (H) gate voltage G2-3 to the gate terminal of the MOS transistor 13-3 to thereby turn on the MOS transistor 13-3.

Thereby, all the current I(DUT) that flows through the first commutation circuit 3-2 is now commutated to the first commutation circuit 3-3 including the MOS transistor 13-3 and DUT 14-3. Therefore, a short pulse current I(DUT14-2) with a pulse width of the period (t24*b*-t24*a*) has flown through the DUT 14-2 of the first commutation circuit 3-2.

Then, at time t24*c*, the MOS transistor 13-3 is turned off, and the gate drive circuit 18-4 applies a high-level (H) gate voltage G2-4 to the gate terminal of the MOS transistor 13-4 to thereby turn on the MOS transistor 13-4.

Thereby, all the current I(DUT) that flows through the first commutation circuit 3-3 is now commutated to the first commutation circuit 3-4 including the MOS transistor 13-4 and DUT 14-4. Therefore, a short pulse current I(DUT14-3) with a pulse width of the period (t24*c*-t24*b*) has flown through the DUT 14-3 of the first commutation circuit 3-3.

Then, at time t25, the MOS transistor 13-4 is turned off, and the gate drive circuit 24 applies a high-level (H) gate voltage G4 to the MOS transistor 22 to thereby turn on the MOS transistor 22. Thereby, all the current I(DUT) that flows through the first commutation circuit 3-4 is now commutated to the second commutation circuit 4 including the MOS transistor 22 and diode 23. Therefore, a short pulse current I(DUT14-4) with a pulse width of the period (t25-t24*c*) has flown through the DUT 14-4 of the first commutation circuit 3-4.

When the MOS transistor 19 is turned off thereafter, the path from the second commutation circuit 4 to the GND is cut off, and the current flowing through the inductor 12 is commutated to the diode 20 and is returned as a current I(D2) back to the power supply 10.

Here, for example, in order to safely continue the commutation of the current I(L) from the first commutation circuit 3-1 to the first commutation circuit 3-2, it is desirable that the on state of the MOS transistor 13-1 of the first commutation circuit 3-1 and the on state of the MOS transistor 13-2 of the first commutation circuit 3-2 slightly overlap.

In addition, in the case of turning on the MOS transistors 13-1 to 13-*n* sequentially, the current I(L) may slightly decrease as the turning-on operation progresses. Therefore, it is considered effective to change the order in which the MOS transistors 13-1 to 13-*n* are turned on at each cycle or multiple cycles (for example, turning-on in the order of the DUTs 14-1, 14-2, 14-3, and then 14-4, in the order of the DUTs 14-2, 14-3, 14-4, and then 14-1, in the order of the DUTs 14-3, 14-4, 14-1, and then 14-2, etc.). This makes it possible to apply the current equally to the DUTs 14-1 to **14-*n***, to thereby apply uniform stress.

As described above, the pulse current application device 1 of the present disclosure is configured so as to turn on the MOS transistors 13-1 to **13-*n* sequentially in order to apply a pulse current sequentially to the plurality of DUTs 14-1 to 14-*n* of the first commutation circuits 3-1 to 3-*n*, in the time period between a time period (corresponding to dt/dt) in which the current I(L) in the inductor 12** increases and a time period (corresponding to −di/dt) in which the current I(L) decreases (the current I(L) is returned back to the power supply).

That is, the time period in which a predetermined current is caused to flow through the inductor and the time period in which energy accumulated in the inductor is returned back to the power supply are shared for the plurality of first commutation circuits, and a pulse current is commutated sequentially to the plurality of first commutation circuits during the time period between these time periods, which results in shortening the total time to apply the pulse current to the plurality of DUTs. In addition, it is possible to apply the pulse current to the plurality of DUTs, which enables shortening the evaluation time and improving the evaluation efficiency.

For example, in evaluating degradation due to the growth of stacking faults caused when a forward current flows through the body diodes (parasitic diodes) or PN diodes of SiC MOSFETs, the use of the pulse current application device 1 makes it possible to perform the evaluation efficiently and in a short time by applying a large pulse current sequentially to the plurality of DUTs.

Heretofore, the embodiment has been described. Each component in the embodiment may be replaced with another component having an equivalent function. In addition, other desired configurations and steps may be added. Furthermore, two or more desired configurations (features) in the embodiment described above may be combined.

According to one aspect, it is possible to successively apply a pulse current to a plurality of devices under test in sequence to thereby reduce the time needed for the current application.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A pulse current application device, comprising:

a first switching element;

an inductive load connected in series with the first switching element, the inductive load and the first switching element being connected between a power supply and a reference potential;

a plurality of first commutation circuits connected in parallel to the inductive load, each of the plurality of first commutation circuits being connected between the reference potential and a connection point of the first switching element and the inductive load, and including:

a current application target, and a second switching element connected in series with the current application target;

a second commutation circuit connected in parallel to the inductive load, the second commutation circuit being configured to have no current flowing therethrough while the second switching element is in a conductive state, and have a current flowing therethrough while the first switching element and the second switching element are in a cut-off state;

a third switching element connected between the inductive load and the reference potential; and a regenerative diode connected between the power supply and a connection point of the inductive load and the third switching element, the regenerative diode being configured to return a current flowing therethrough back to the power supply while the third switching element is in a cut-off state.

2. The pulse current application device according to claim 1, wherein the second commutation circuit includes:

a fourth switching element that enters into a conductive state in response to the second switching element entering into the cut-off state, and a diode that is forward-biased while the fourth switching element is in the conductive state.

3. The pulse current application device according to claim 2, wherein the plurality of first commutation circuits includes a first first commutation circuit and a second first commutation circuit; and the pulse current application device is so configured that:

responsive to the first switching element entering into a conductive state, the inductive load accumulates energy received from the power supply, and the second switching element of the first first commutation circuit enters into the conductive state so that a current through the inductive load is applied in a reverse bias state to the current application target of the first first commutation circuit; and responsive to the first switching element entering into the cut-off state, the current through the inductive load is commutated to the current application target of the first first commutation circuit, the second switching element of the first first commutation circuit enters into the cut-off state after the current through the inductive load is commutated to the current application target of the first first commutation circuit for a first prescribed period of time, the second switching element in the second first commutation circuit enters into the conductive state so that the current through the inductive load is commutated to the current application target of the second first commutation circuit, and the second switching element of the second first commutation circuit enters into the cut-off state after the current through the inductive load is commutated to the current application target of the second first commutation circuit for a second prescribed period of time.

4. The pulse current application device according to claim 3, wherein the pulse current application device is further configured so that:

in response to the second switching element of the second first commutation circuit entering into the cut-off state, the fourth switching element enters into the conductive state so that the current through the inductive load is commutated to the second commutation circuit, and the third switching element enters into the cut-off state so that the current through the inductive load is returned back to the power supply via the regenerative diode.

5. The pulse current application device according to claim 1, wherein the second commutation circuit includes a plurality of series-connected diodes, and a sum of forward voltages of the series-connected diodes is higher than a predetermined value, which is a voltage drop in the second switching element and the current application target of one of the plurality of first commutation circuits when a predetermined current flows through the second switching element and the current application target.

6. The pulse current application device according to claim 1, wherein an order in which the current through the inductive load is commutated to the plurality of first commutation circuits is changed at each cycle or after multiple cycles.

7. A control method of a pulse current application device including a first switching element, an inductive load connected in series with the first switching element, the inductive load and the first switching element being connected between a power supply and a reference potential, a plurality of first commutation circuits connected in parallel to the inductive load, each of the plurality of first commutation circuits being connected between the reference potential and a connection point of the first switching element and the inductive load and including a current application target, and a second switching element connected in series with the current application target, the plurality of first commutation circuits including a first first commutation circuit and a second first commutation circuit, a second commutation circuit connected in parallel to the inductive load, the second commutation circuit being configured to have no current flowing therethrough while the second switching element is in a conductive state, and have a current flowing therethrough while the first switching element and the second switching element are in a cut-off state, a third switching element connected between the inductive load and the reference potential, and a regenerative diode connected between the power supply and a connection point of the inductive load and the third switching element, the regenerative diode being configured to return a current flowing therethrough back to the power supply while the third switching element is in a cut-off state, the control method comprising:

placing the first switching element in a conductive state so as to accumulate, in the inductive load, energy received from the power supply, placing the second switching element of the first first commutation circuit in the conductive state so as to apply, in a reverse bias state, a current flowing through the inductive load to the current application target of the first first commutation circuit, placing the first switching element in the cut-off state so as to commutate the current flowing through the inductive load to the current application target of the first first commutation circuit, placing the second switching element of the first first commutation circuit in the cut-off state after commutating the current flowing through the inductive load to the current application target of the first first commutation circuit for a first prescribed period of time, placing the second switching element of the second first commutation circuit in the conductive state so as to commutate the current flowing through the inductive load to the current application target of the second first commutation circuit, and placing the second switching element of the second first commutation circuit in the cut-off state after commutating the current flowing through the inductive load to the current application target of the second first commutation circuit for a second prescribed period of time.

8. The control method of the pulse current application device according to claim 7, wherein the second commutation circuit includes:

a fourth switching element that enters into a conductive state in response to the second switching element entering into a cut-off state, and a diode that is forward-biased while the fourth switching element is in the conductive state, and the control method further includes placing, in response to the second switching element of the second first commutation circuit entering into the cut-off state, the fourth switching element in the conductive state so as to commutate the current flowing through the inductive load to the second commutation circuit, and placing the third switching element in the cut-off state so as to return the current flowing through the inductive load back to the power supply via the regenerative diode.

* * * * *